(12) United States Patent
Schumacher et al.

(10) Patent No.: US 9,819,131 B2
(45) Date of Patent: Nov. 14, 2017

(54) RJ-45 COMMUNICATION PLUG WITH PLUG BLADES RECEIVED IN APERTURES IN A FRONT EDGE OF A PRINTED CIRCUIT BOARD

(71) Applicant: CommScope, Inc. of North Carolina, Hickory, NC (US)

(72) Inventors: Richard A. Schumacher, Dallas, TX (US); Scott Lynn Michaelis, Plano, TX (US)

(73) Assignee: CommScope, Inc. of North Carolina, Hickory, NC (US)

(*) Notice: Subject to any disclaimer, the term of this patent is extended or adjusted under 35 U.S.C. 154(b) by 0 days.

(21) Appl. No.: 15/333,228

(22) Filed: Oct. 25, 2016

(65) Prior Publication Data
US 2017/0040762 A1 Feb. 9, 2017

Related U.S. Application Data

(63) Continuation of application No. 14/708,366, filed on May 11, 2015, now Pat. No. 9,509,107, which is a
(Continued)

(51) Int. Cl.
*H01R 24/00* (2011.01)
*H01R 24/64* (2011.01)
(Continued)

(52) U.S. Cl.
CPC ............ *H01R 24/64* (2013.01); *H01R 12/53* (2013.01); *H01R 13/6466* (2013.01);
(Continued)

(58) Field of Classification Search
CPC ............ H01R 13/6461; H01R 13/6463; H01R 23/005; H01R 23/025
(Continued)

(56) References Cited

U.S. PATENT DOCUMENTS 5,205,762 A 4/1993 Carney
5,997,358 A 12/1999 Adriaenssens et al.
(Continued)

FOREIGN PATENT DOCUMENTS

DE 10 2006 010 279 A1 9/2007
EP 2 360 796 A1 8/2011
(Continued)

OTHER PUBLICATIONS

International Search Report Corresponding to International Application No. PCT/US2013/025316; dated Jun. 28, 2013; 20 Pages.
(Continued)

*Primary Examiner* — Chandrika Prasad
(74) *Attorney, Agent, or Firm* — Myers Bigel, P.A.

(57) ABSTRACT

Communications plugs are provided which include a printed circuit board having a plurality of elongated conductive traces and a plurality of plug blades. Each plug blade has a first section that extends along a top surface of the printed circuit board and a second section that extends along a front edge of the printed circuit board. Additionally, each plug blade may have a thickness that is at least twice the thickness of the elongated conductive traces. The plug blades may be low profile plug blades that are manufactured separately from the printed circuit board.

8 Claims, 15 Drawing Sheets

Related U.S. Application Data continuation of application No. 13/762,433, filed on Feb. 8, 2013, now Pat. No. 9,054,460.

(60) Provisional application No. 61/597,918, filed on Feb. 13, 2012.

(51) Int. Cl.

| | | |
|---|---|---|
| *H01R 12/53* | (2011.01) | |
| *H01R 13/6466* | (2011.01) | |
| *H01R 13/6469* | (2011.01) | |
| *H01R 13/66* | (2006.01) | |
| *H01R 24/28* | (2011.01) | |
| *H05K 1/11* | (2006.01) | |
| *H05K 1/02* | (2006.01) | |
| *H01R 107/00* | (2006.01) | |

(52) U.S. Cl.
CPC ....... *H01R 13/6469* (2013.01); *H01R 13/665* (2013.01); *H01R 13/6658* (2013.01); *H01R 23/005* (2013.01); *H01R 24/28* (2013.01); *H05K 1/115* (2013.01); *H05K 1/117* (2013.01); *H01R 2107/00* (2013.01); *H01R 2201/04* (2013.01); *H05K 1/0245* (2013.01); *H05K 2201/04* (2013.01); *H05K 2201/0949* (2013.01); *H05K 2201/09845* (2013.01); *H05K 2201/1034* (2013.01); *H05K 2201/10356* (2013.01); *Y10T 29/49124* (2015.01)

(58) Field of Classification Search
USPC ........................................ 439/676, 941, 344
See application file for complete search history.

(56) References Cited

U.S. PATENT DOCUMENTS

| | | | |
|---|---|---|---|
| 6,019,631 A * | 2/2000 | Chen | H01R 13/514 |
| | | | 439/541.5 |
| 6,078,012 A | 6/2000 | Suzuki et al. | |
| 6,146,209 A * | 11/2000 | Francis | H01R 24/64 |
| | | | 361/679.4 |
| 6,194,652 B1 | 2/2001 | Ivan | |
| 6,244,906 B1 | 6/2001 | Hashim et al. | |
| 6,283,768 B1 | 9/2001 | Van Naarden | |
| 6,290,532 B1 | 9/2001 | Vermeersch et al. | |
| 6,617,939 B1 | 9/2003 | Vermeersch | |
| 6,736,673 B1 * | 5/2004 | Simmons | H01R 24/64 |
| | | | 439/541.5 |
| 6,764,333 B2 | 7/2004 | Pocrass | |
| 6,821,142 B1 | 11/2004 | Rayev et al. | |
| 7,201,618 B2 | 4/2007 | Ellis et al. | |
| 7,249,979 B2 | 7/2007 | Gerber et al. | |
| 7,281,957 B2 | 10/2007 | Caveney | |
| 7,427,218 B1 | 9/2008 | Hashim et al. | |
| 7,503,810 B1 | 3/2009 | Goodrich | |
| 7,591,686 B2 * | 9/2009 | Ellis | H01R 13/6658 |
| | | | 439/676 |
| 7,604,515 B2 | 10/2009 | Siemon et al. | |
| 7,857,635 B2 | 12/2010 | Goodrich et al. | |
| 7,980,899 B2 | 7/2011 | Siemon et al. | |
| 8,011,972 B2 | 9/2011 | Caveney et al. | |
| 8,083,551 B2 | 12/2011 | Hetzer et al. | |
| 8,197,286 B2 | 6/2012 | Larsen et al. | |
| 8,435,083 B2 | 5/2013 | Hetzer et al. | |
| 8,858,267 B2 | 10/2014 | Hashim et al. | |
| 8,894,447 B2 | 11/2014 | Canning | |
| 8,920,199 B2 | 12/2014 | Schumacher | |
| 9,054,460 B2 | 6/2015 | Schumacher | |
| 2004/0092154 A1 | 5/2004 | Doorhy et al. | |
| 2004/0116081 A1 | 6/2004 | Crudele et al. | |
| 2005/0266721 A1 | 12/2005 | Milner et al. | |
| 2006/0131056 A1 | 6/2006 | Hackman | |
| 2007/0161296 A1 | 7/2007 | Carroll et al. | |
| 2007/0243728 A1 * | 10/2007 | Ellis | H01R 13/6658 |
| | | | 439/76.1 |
| 2008/0132123 A1 | 6/2008 | Milette et al. | |
| 2009/0068883 A1 | 3/2009 | Goodrich | |
| 2009/0142968 A1 | 6/2009 | Goodrich | |
| 2010/0003863 A1 | 1/2010 | Siemon et al. | |
| 2010/0203763 A1 | 8/2010 | Hetzer et al. | |
| 2010/0317230 A1 | 12/2010 | Larsen et al. | |
| 2012/0100744 A1 | 4/2012 | Bolouri-Saransar et al. | |
| 2012/0164884 A1 | 6/2012 | Hetzer et al. | |
| 2013/0210288 A1 | 8/2013 | Schumacher et al. | |
| 2013/0210289 A1 | 8/2013 | Schumacher et al. | |
| 2013/0225009 A1 | 8/2013 | Hashim et al. | |
| 2014/0187090 A1 | 7/2014 | Larsen | |
| 2014/0206240 A1 | 7/2014 | Schumacher et al. | |
| 2014/0273629 A1 | 9/2014 | Canning et al. | |
| 2014/0273657 A1 | 9/2014 | Hashim | |
| 2017/0155218 A1 * | 6/2017 | Canning | H01R 24/64 |

FOREIGN PATENT DOCUMENTS

| | | |
|---|---|---|
| JP | 2008-103318 A | 5/2008 |
| WO | WO 96/37015 | 11/1996 |
| WO | WO 2006/081423 A1 | 8/2006 |

OTHER PUBLICATIONS

European Search Report for corresponding Application No. 14151014.9, dated Jul. 16, 2014, 6 pages.
Notification of Transmittal of the International Preliminary Report on Patentability, for PCT/US2013/025316, dated Mar. 17, 2014, 8 pages.
Invitation to Pay Additional Fees corresponding to International Application No. PCT/US2013/025316; dated Apr. 10, 2013; 5 pages.
European Examination Report for corresponding Application No. 13704703.1, dated Apr. 7, 2017, 8 pages.

* cited by examiner

RJ-45 COMMUNICATION PLUG WITH PLUG BLADES RECEIVED IN APERTURES IN A FRONT EDGE OF A PRINTED CIRCUIT BOARD

CROSS REFERENCE TO RELATED APPLICATIONS

The present application claims priority under 35 U.S.C. §120 to U.S. application Ser. No. 14/708,366, filed May 11, 2015, which in turn claims priority from under 35 U.S.C. §120 to U.S. application Ser. No. 13/762,433, filed Feb. 8, 2013, which in turn claims priority from U.S. Provisional Patent Application Ser. No. 61/597,918, filed Feb. 13, 2012, the entire content of each of which is incorporated by reference herein in its entirety.

FIELD OF THE INVENTION

The present invention relates generally to communications connectors and, more particularly, to modular communications plugs.

BACKGROUND

Many hardwired communications systems use plug and jack connectors to connect a communications cable to another communications cable or to a piece of equipment such as a computer, printer, server, switch or patch panel. By way of example, high speed communications systems routinely use such plug and jack connectors to connect computers, printers and other devices to local area networks and/or to external networks such as the Internet. FIG. 1 depicts a highly simplified example of such a hardwired high speed communications system that illustrates how plug and jack connectors may be used to interconnect a computer 11 to, for example, a network server 20.

As shown in FIG. 1, the computer 11 is connected by a cable 12 to a communications jack 15 that is mounted in a wall plate 19. The cable 12 is a patch cord that includes a communications plug 13, 14 at each end thereof. Typically, the cable 12 includes eight insulated conductors. As shown in FIG. 1, plug 14 is inserted into an opening or "plug aperture" 16 in the front side of the communications jack 15 so that the contacts or "plug blades" of communications plug 14 mate with respective contacts of the communications jack 15. If the cable 12 includes eight conductors, the communications plug 14 and the communications jack 15 will typically each have eight contacts. The communications jack 15 includes a wire connection assembly 17 at the back end thereof that receives a plurality of conductors (e.g., eight) from a second cable 18 that are individually pressed into slots in the wire connection assembly 17 to establish mechanical and electrical connections between each conductor of the second cable 18 and a respective one of a plurality of conductive paths through the communications jack 15. The other end of the second cable 18 is connected to a network server 20 which may be located, for example, in a telecommunications closet of a commercial office building. Communications plug 13 similarly is inserted into the plug aperture of a second communications jack (not pictured in FIG. 1) that is provided in the back of the computer 11. Thus, the patch cord 12, the cable 18 and the communications jack 15 provide a plurality of electrical paths between the computer 11 and the network server 20. These electrical paths may be used to communicate electrical information signals between the computer 11 and the network server 20.

It will be appreciated that typically one or more patch panels or switches, along with additional communications cabling, would be included in the electrical path between the second communications cable 18 and the network server 20. However, for ease of description, these additional elements have been omitted from FIG. 1 and the second communications cable 18 is instead shown as being directly connected to the server 20.

In the above-described communications systems, the information signals are typically transmitted between devices over a pair of conductors (hereinafter a "differential pair" or simply a "pair") rather than over a single conductor. The two conductors of each differential pair are typically twisted tightly together in the communications cables and patch cords, and thus each cable and patch cord includes four twisted differential pairs of conductors. As is known to those of skill in the art, the signals transmitted on each conductor of a differential pair have equal magnitudes, but opposite phases, and the information signal is embedded as the voltage difference between the signals carried on the two conductors of the pair. When signals are transmitted over a conductor (e.g., an insulated copper wire) in a communications cable, electrical noise from external sources may be picked up by the conductor, degrading the quality of the signal carried by the conductor. When the signal is transmitted over a twisted differential pair of conductors, each conductor in the differential pair often picks up approximately the same amount of noise from these external sources. Because approximately an equal amount of noise is added to the signals carried by both conductors of the twisted differential pair, the information signal is typically not disturbed, as the information signal is extracted by taking the difference of the signals carried on the two conductors of the differential pair, and this subtraction process may mostly cancel out the noise signal.

As shown in FIG. 1, a channel is formed between the computer 11 and the server 20 by cascading plugs, jacks and cable segments to provide connectivity between the two devices 11, 20. In this channel, the proximities and routings of the conductors and contacting structures within each plug-jack connection (e.g., where plug 14 mates with jack 15) can produce capacitive and/or inductive couplings. Moreover, since four differential pairs are usually bundled together in a single cable, additional capacitive and/or inductive coupling may occur between the differential pairs within each cable segment. These capacitive and inductive couplings in the connectors and cabling give rise to another type of noise that is called "crosstalk."

In particular, "crosstalk" refers to unwanted signal energy that is induced onto the conductors of a first "victim" differential pair from a signal that is transmitted over a second "disturbing" differential pair. The induced crosstalk may include both near-end crosstalk (NEXT), which is the crosstalk measured at an input location corresponding to a source at the same location (i.e., crosstalk whose induced voltage signal travels in an opposite direction to that of an originating, disturbing signal in a different path), and far-end crosstalk (FEXT), which is the crosstalk measured at the output location corresponding to a source at the input location (i.e., crosstalk whose signal travels in the same direction as the disturbing signal in the different path). Both types of crosstalk comprise an undesirable noise signal that interferes with the information signal that is transmitted over the victim differential pair.

One method of reducing crosstalk in a communications system is to twist the conductors of each differential pair together at different rates that are not harmonically related.

This technique typically ensures that each conductor in a cable picks up approximately equal amounts of signal energy from the two conductors of each of the other differential pairs included in the cable. While such twisting of the conductors and/or various other techniques may substantially reduce crosstalk in cables, most communications systems include communications connectors (i.e., jacks, plugs, connecting blocks, etc.) that interconnect the cables and/or connect the cables to computer hardware. Unfortunately, the connector configurations that were adopted years ago—and which still are in effect in order to maintain backwards compatibility—generally did not maintain the arrangement and geometry of the conductors of each differential pair so as to closely control the impedance of each pair or to minimize the crosstalk coupling between the differential pairs in the connector hardware. For example, pursuant to the TIA/EIA-568-B.2-1 standard approved Jun. 20, 2002 by the Telecommunications Industry Association, in the connection region where the blades of a modular plug mate with the contacts of the modular jack (referred to herein as the "plug-jack mating region"), the eight conductors 1-8 must be aligned in a row, with the eight conductors 1-8 arranged as four differential pairs specified as depicted in FIG. 2. As is apparent from FIG. 2, this arrangement of the eight conductors 1-8 will result in unequal coupling between the differential pairs, and hence both NEXT and FEXT is introduced in each connector in industry standardized communications systems.

The above-referenced TIA/EIA-568-B.2-1 standard requires compliance with interface specifications set forth in the FCC Part 68.500 document, which defines, among other things, the dimensions and configurations for various plug-jack interfaces, including plugs and jacks that conform to the Registered Jack 45 ("RJ-45") wiring standard. Herein, a plug or jack that substantially complies with the RJ-45 wiring standard is referred to as an "RJ-45" plug or jack.

A wide variety of RJ-45 plugs are known in the art, including plugs that directly mount each conductor of the communications cable to a respective plug blade and plugs that terminate the conductors into a printed circuit board and use conductive traces on the printed circuit board to connect each conductor of the cable to a respective plug blade that is mounted on the printed circuit board. However, RJ-45 plugs having improved characteristics and/or performance are desired.

SUMMARY

Pursuant to embodiments of the present invention, RJ-45 communications plugs are provided which include a printed circuit board having a plurality of conductive traces and a plurality of plug blades. Each plug blade has a first section that extends along a top surface of the printed circuit board and a second section that extends along a front edge of the printed circuit board. In some embodiments, each plug blade may have a thickness that is at least twice the thickness of the elongated conductive traces.

In some embodiments, the first section of each plug blade has a thickness of between about 10 mils and about 20 mils (i.e., each plug blade extends between about 10 mils and about 20 mils above the top surface of the underlying printed circuit board). Moreover, in some embodiments, one or more of the plug blades may include a third section that extends along a bottom surface of the printed circuit board. Each plug blade may be a metal plug blade. In some cases the plug blades may be formed of a resilient metal, and each plug blade may resiliently grip both the top and bottom surfaces of the printed circuit board.

In some embodiments, the printed circuit board includes a plurality of vias, and each plug blade has a termination section that mounts into a respective one of these vias. In some embodiments, these vias may be located on the front edge of the printed circuit board, while in other embodiments, at least some of the vias may be located on the top surface of the printed circuit board. The vias may be disposed in more than one row. In still other embodiments, each plug blade may be soldered onto a respective conductive pad on the printed circuit board. The RJ-45 communications plugs according to embodiments of the present invention may be mounted on a first end of a communications cable, and a second RJ-45 communications plug may be mounted on a second end of the communications cable to provide a patch cord.

Pursuant to certain embodiments of the present invention, modular communications plugs are provided that include a printed circuit board, a plurality of wire connection terminals mounted on or in the printed circuit board and a plurality of plug blades mounted on the printed circuit board. In these embodiments, each plug blade may extend along the front edge of the printed circuit board.

In some embodiments, each plug blade may extend at least 3 mils forwardly from the front edge of the printed circuit board. Each plug blade may include a first section that extends along a top surface of the printed circuit board and a second section that extends from the first section downwardly along the front edge of the printed circuit board. Each plug blade may further include a third section that extends along a bottom surface of the printed circuit board, where the second section connects the first section to the third section. Each of the plurality of wire connection terminals may be implemented as a metal-plated via in the printed circuit board. The conductors of a communication cable may be terminated directly into respective ones of these metal-plated vias.

Pursuant to further embodiments of the present invention, communications patch cords are provided that include a cable having eight insulated conductors that are arranged as four twisted pairs of conductors. A first plug is mounted on a first end of the cable and a second plug is mounted on the second end of the cable. The first plug may include a plug housing, a printed circuit board mounted within the plug housing that includes a plurality of plug blades on a front edge thereof, and a plurality of metal-plated vias in the printed circuit board, where each of the conductors of the cable is terminated into a respective one of the metal-plated vias. The second plug may be identical to the first plug in some embodiments.

In some embodiments, the metal-plated vias in the printed circuit board are arranged in at least two rows. The conductors of the first of the twisted pairs of conductors of the cable is located at a first distance below a rear edge of the printed circuit board and the conductors of a second of the twisted pairs of conductors is located at a second distance below the rear edge of the printed circuit board. The first distance may be greater than the second distance. In some embodiments, the conductors of a third of the twisted pairs of conductors may be located at a third distance below a rear edge of the printed circuit board, where the third distance is greater than the second distance but less than the first distance.

Pursuant to still further embodiments of the present invention, communications plugs are provided that include a plug housing that includes a latch, a plurality of plug blades that are mounted within a forward portion of the plug housing and an adapter that is slidably mounted to the plug housing, the adapter slidable between a first position in which the adapter increases a height of the forward portion of the plug housing such that the plug will properly latch within an industry standards-compliant RJ-45 jack and a second position in which the adapter is slid rearwardly away from the forward portion of the plug housing.

Pursuant to yet additional embodiments of the present invention, communications patch cords are provided that include a cable having eight insulated conductors that are arranged as four twisted pairs of conductors. A first plug is mounted on a first end of the cable and a second plug is mounted on the second end of the cable. The first plug may include a plug housing, a printed circuit board mounted within the plug housing that includes a plurality of plug blades on a front edge thereof, and a plurality of conductive pads. Each of the conductors of the cable may be terminated directly onto a respective one of the conductive pads by, for example, soldering.

DETAILED DESCRIPTION

Figure 1:
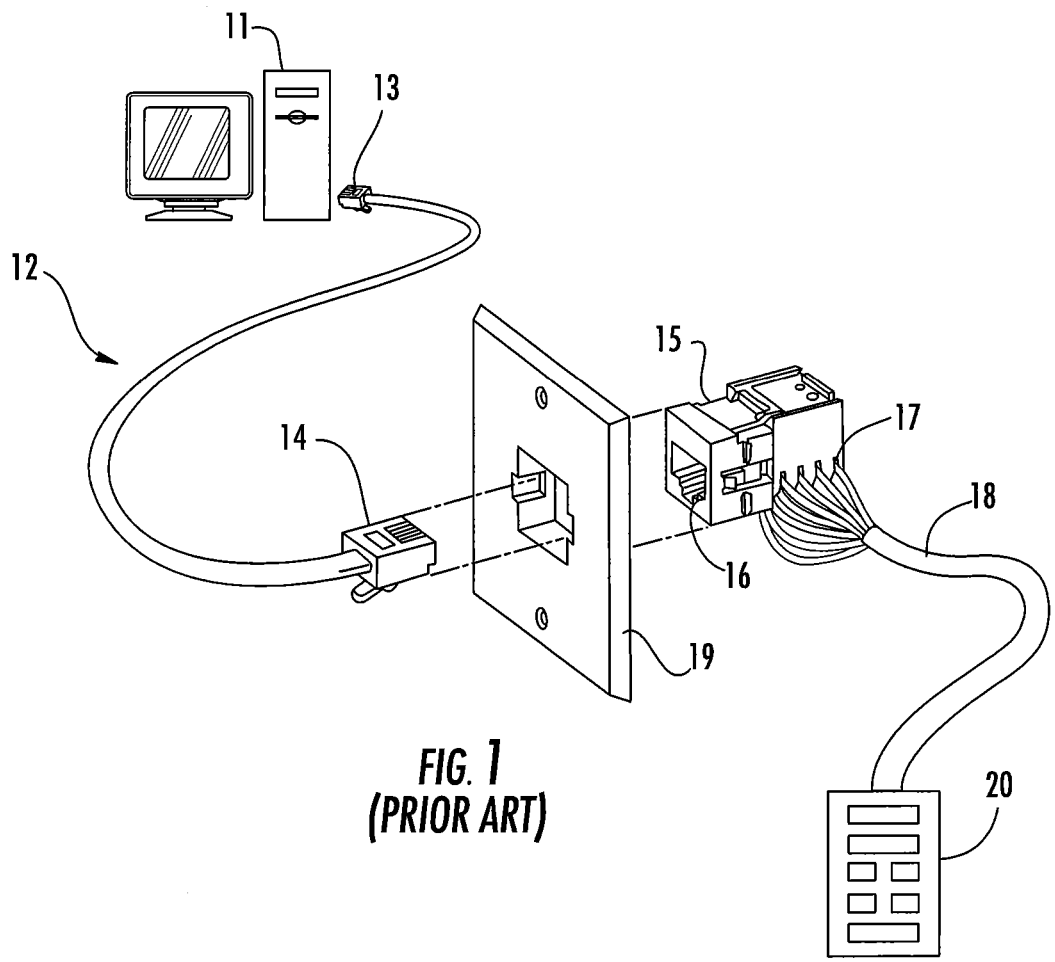
FIG. 1 is a simplified schematic diagram illustrating the use of conventional communications plugs and jacks to interconnect a computer with network equipment.
Figure 2:
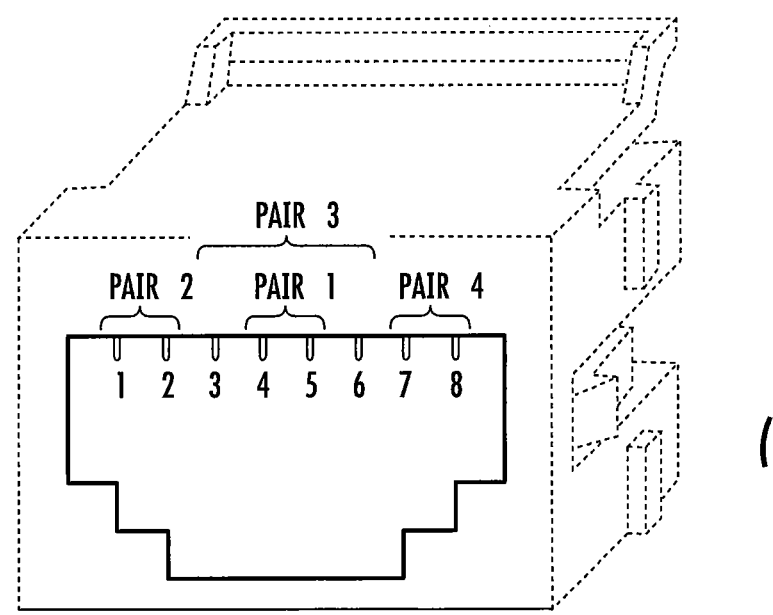
FIG. 2 is a schematic diagram illustrating the modular jack contact wiring assignments for a conventional 8-position communications jack (TIA 568B) as viewed from the front opening of the jack.

Pursuant to embodiments of the present invention, small form-factor modular communications plugs are provided that include low profile plug blades that are surface mounted on a printed circuit board. The communications plugs according to embodiments of the present invention may exhibit enhanced electrical performance (e.g., improved crosstalk performance, reduced return loss, etc.) and, in some embodiments, may be less expensive to manufacture.

The low profile plug blades may comprise, for example, metal strips or wires that are mounted on the top surface and front edge of the printed circuit board. In some embodiments, each plug blade may comprise a metal strip that is formed generally into an "L" shape, with the short side of the "L" extending vertically along the front edge of the printed circuit board and the longer side of the "L" extending along the top surface of the printed circuit board. In other embodiments, each plug blade may comprise a metal strip that is formed generally into a "U" shape, with the two sides of the "U" extending, respectively, along the top and bottom surfaces of the printed circuit board and the bottom of the "U" extending along the front edge of the printed circuit board. The plug blades may be mounted on the printed circuit board in a variety of ways, including by soldering, by including terminations on the metal strips that mount into apertures in the top surface, bottom surface and/or front edge of the printed circuit board, by forming the plug blades out of resilient materials that allow the plug blades to snap into place in predefined positions on the printed circuit board, etc. The plug blades may have a thickness that is substantially greater than the thickness of printed circuit board traces that are commonly used in RJ-45 connectors (e.g., at least twice as thick, and more commonly at least five (5) times as thick as such standard printed circuit board traces), but may have a thickness that is substantially less than the thickness of conventional plug blades (e.g., at least three times less). Herein, the "thickness" of a plug blade that is mounted on a surface of a printed circuit board refers to the distance that the plug blade extends above the underlying surface of the printed circuit board. The low profile plug blades according to embodiments of the present invention may exhibit substantially less crosstalk as compared to conventional plug blades due to the reduction in facing surface area between adjacent plug blades.

The eight insulated conductors of a patch cord can be attached to the plugs according to embodiments of the present invention by stripping the insulation from the conductors and terminating each conductor directly into a respective one of eight metal-plated vias in the printed circuit board of each plug. The conductors may be soldered in place within their respective metal-plated vias or, alternatively, may be press-fit in place. The metal-plated vias may be arranged in a variety of patterns on the printed circuit board, and these patterns may be designed to enhance crosstalk and/or return loss performance.

Figure 3:
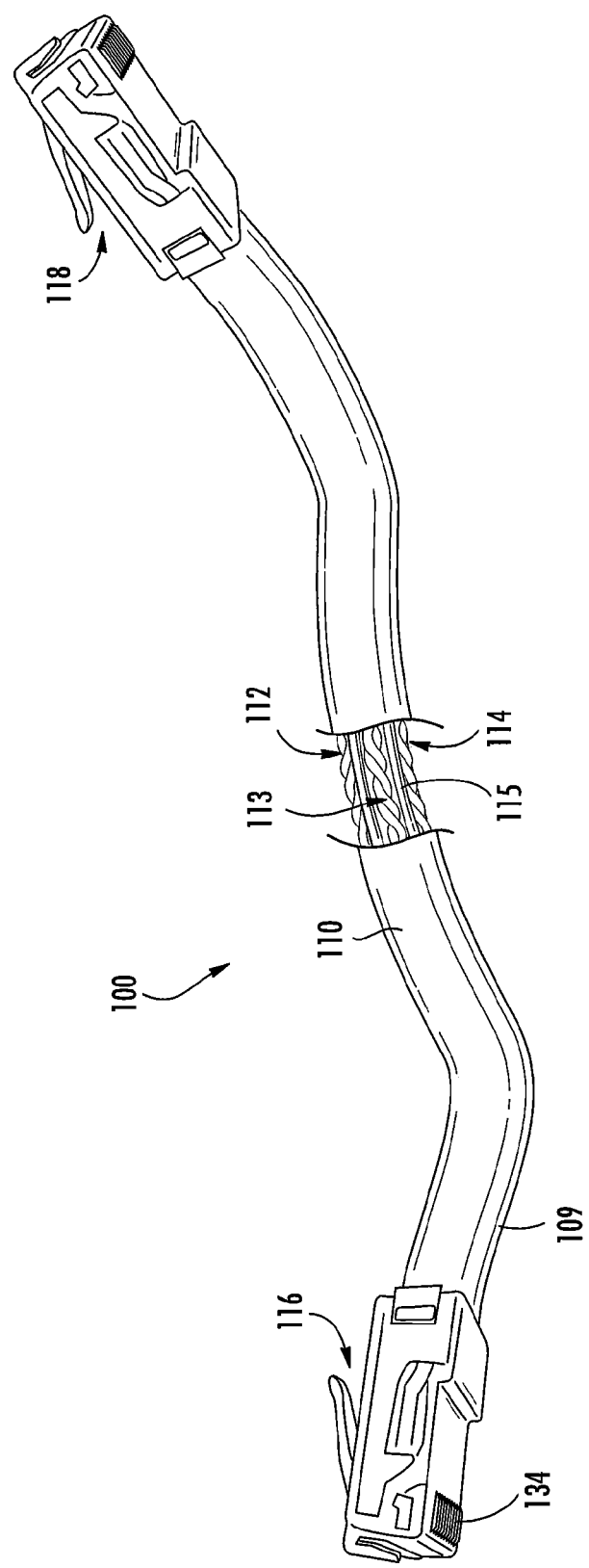
FIG. 3 is a perspective view of a patch cord according to certain embodiments of the present invention.
Figure 4:
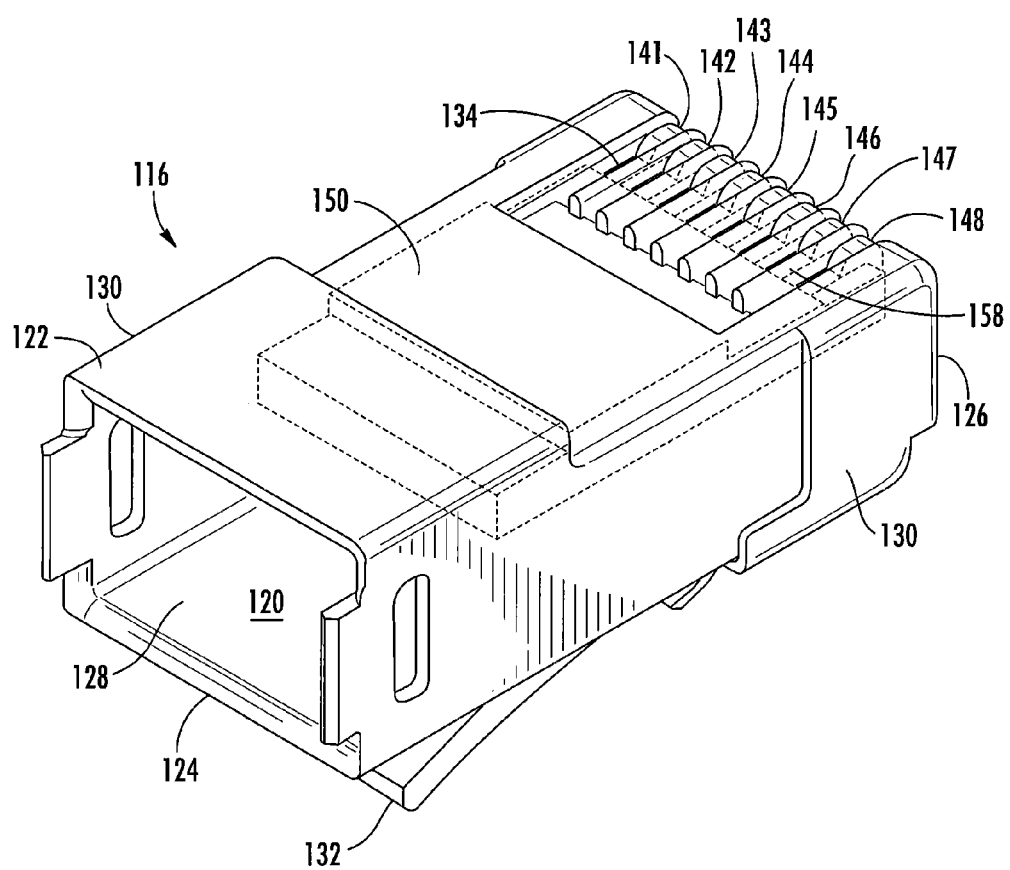
FIG. 4 is a top, rear perspective view of the plug housing and printed circuit board of one of the plugs illustrated in FIG. 3.

FIGS. 3-5 illustrate a patch cord 100 and various components thereof according to certain embodiments of the present invention. In particular, FIG. 3 is a perspective view of the patch cord 100. FIG. 4 is a rear perspective view of the plug 116 that is included on the patch cord 100 of FIG. 3. FIGS. 5A-5D are various perspective views of a portion of the printed circuit board structure 150 of plug 116 of FIG. 4 that illustrate how the conductors 101-108 of the patch cord 100 connect to the plug blades 141-148 that are mounted on the printed circuit board structure 150.

As shown in FIG. 3, the patch cord 100 includes a cable 109 that has eight insulated conductors 101-108 enclosed in a jacket 110 (note that the conductors 101-108 are not individually numbered in FIG. 3, and conductors 104 and 105 are not visible in FIG. 3). The insulated conductors 101-108 may be arranged as four twisted pairs of conductors 111-114 (pair 111 is not visible in FIG. 3), with conductors 104 and 105 twisted together to form pair 111, conductors 101 and 102 twisted together to form twisted pair 112, conductors 103 and 106 twisted together to form twisted pair 113, and conductors 107 and 108 twisted together to form twisted pair 114. A separator 115 such as a tape separator or a cruciform separator may be provided that separates one or more of the twisted pairs 111-114 from one or more of the other twisted pairs 111-114. A first plug 116 is attached to a first end of the cable 109 and a second plug 118 is attached to the second end of the cable 109 to form the patch cord 100. Strain relief boots (not shown in FIG. 3) may be attached to each of the plugs 116, 118 which resist the tendency for a longitudinal force applied to the cable 109 to pull the cable 109 out of the plugs 116, 118.

FIG. 4 is a top-rear perspective view of the plug 116 of patch cord 100. In order to simplify the drawing, a rear cap of the plug housing, various wire grooming and wire retention mechanisms and the strain relief boot are not shown in FIG. 4. As shown in FIG. 4, the communications plug 116 includes a housing 120 that has a top face 122, a bottom face 124, a front face 126, a rear opening 128 that receives a rear cap (not shown) and a pair of side faces 130. A plug latch 132 extends from the bottom face 124. The top and front faces 122, 126 of the housing 120 include a plurality of longitudinally extending slots 134 that expose a plurality of plug blades 141-148. The communications cable 109 (see FIG. 3) is received through the rear opening 128. A rear cap (not shown in FIG. 4) that includes a cable aperture locks into place over the rear opening 128 of housing 120 after the communications cable 109 has been inserted therein. As is also shown in FIG. 4, the communications plug 116 further includes a printed circuit board structure 150 which is disposed within the housing 120, and the plug blades 141-148 are mounted at the forward edge of the printed circuit board structure 150 so that the blades 141-148 can be accessed through the slots 134 in the top face 122 and front face 126 of the housing 120. The housing 120 may be made of a suitable insulative plastic material that meets applicable standards with respect to, for example, electrical breakdown resistance and flammability such as, for example, polycarbonate, ABS, ABS/polycarbonate blend or like dielectric molded materials. Any conventional housing 120 may be used that is configured to hold the printed circuit board structure 150, and hence the housing 120 is not described in further detail herein.

FIGS. 5A-5D are enlarged perspective views of a front portion of the printed circuit board structure 150 and the plug blades 141-148 that illustrate the printed circuit board structure 150 in greater detail and that show how the insulated conductors 101-108 of communications cable 109 may be electrically connected to the respective plug blades 141-148 through the printed circuit board structure 150.

The printed circuit board structure 150 may comprise, for example, a conventional printed circuit board, a specialized printed circuit board (e.g., a flexible printed circuit board) or any other appropriate type of wiring board. In the embodiment of the present invention depicted in FIGS. 3-5, the printed circuit board structure 150 comprises a pair of printed circuit boards that includes a first planar multi-layer printed circuit board 152 and a second, smaller planar double-sided printed circuit board 154 that is mounted on top of the first printed circuit board 152. The second printed circuit board 154 may be permanently adjoined to the first printed circuit board 152 by any conventional technique including adhesives, ultrasonic welding, soldering, etc. It will be appreciated that a single printed circuit board may be used instead of the dual printed circuit board structure 150 illustrated in the exemplary embodiment of FIGS. 3-5.

Figure 5A:
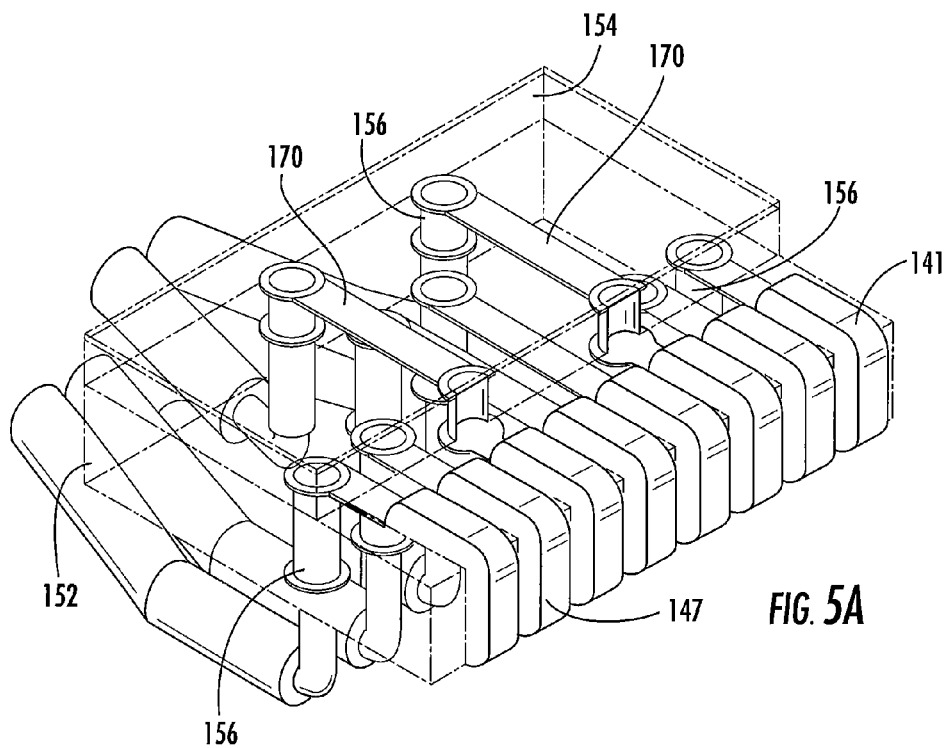
FIG. 5A is a top, front perspective, transparent view of a portion of the printed circuit board of FIG. 4 that illustrates how the conductors of the patch cord electrically connect to the plug blades that are mounted on the printed circuit board.
Figure 5B:
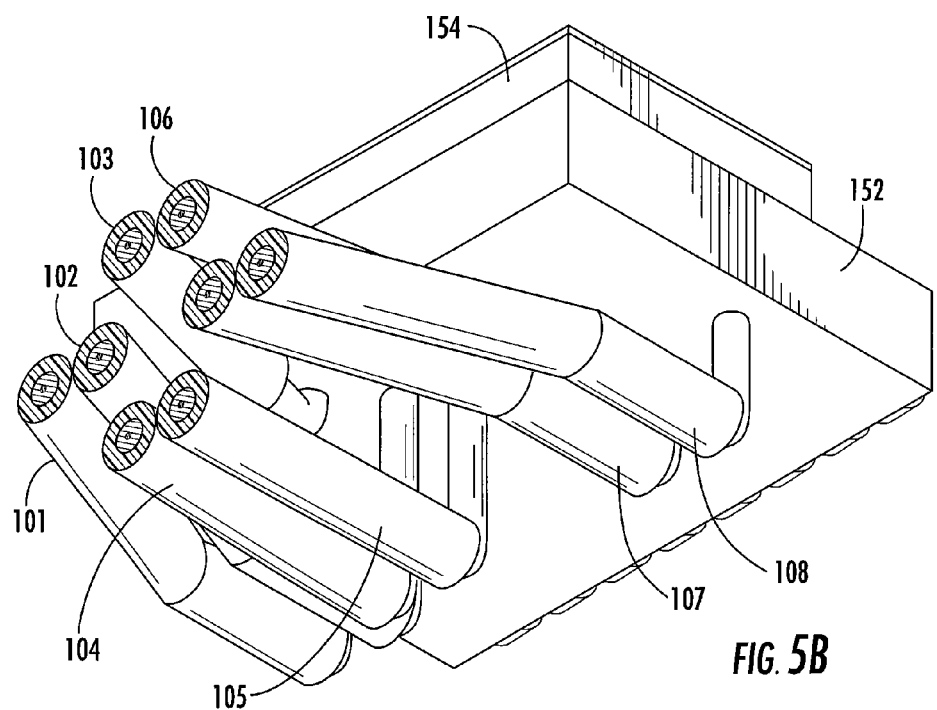
FIG. 5B is a rear, bottom perspective view of a portion of the printed circuit board of FIG. 4 that illustrates how the conductors of the patch cord terminate into apertures in the printed circuit board.
Figure 5C:
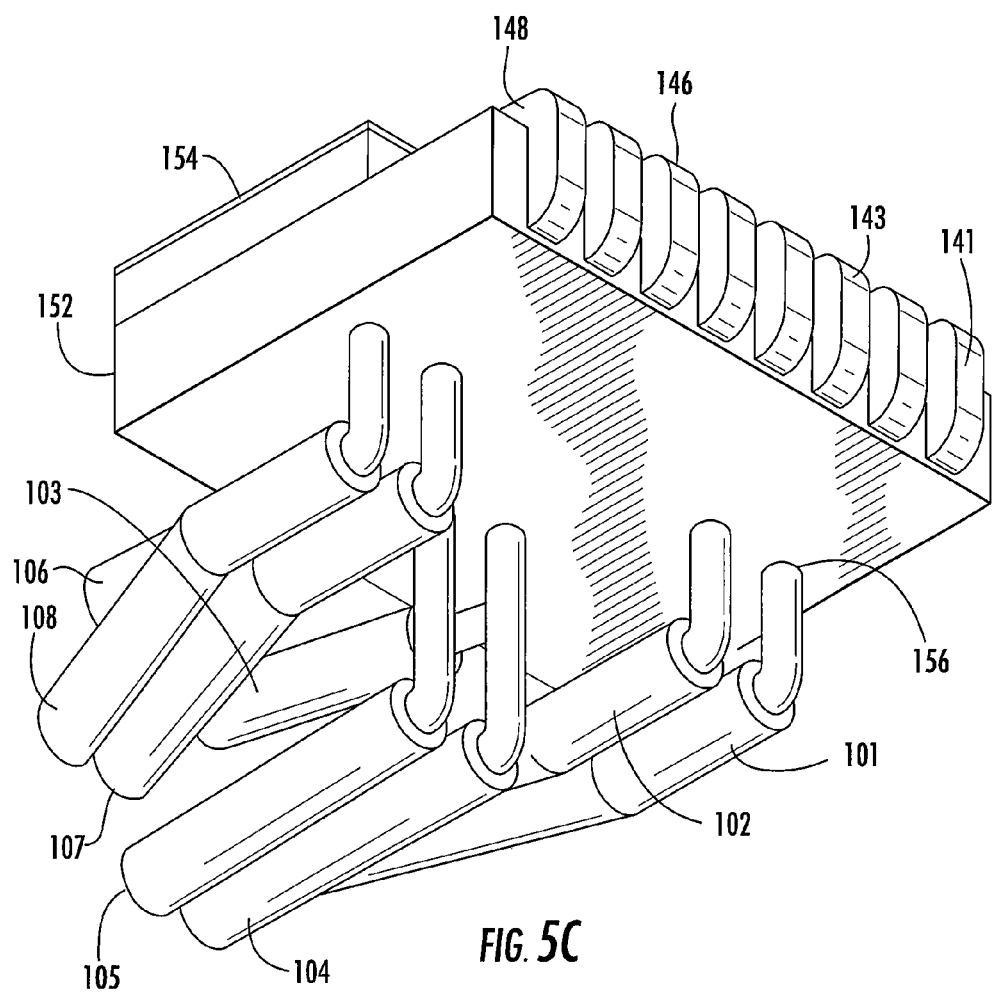
FIG. 5C is a front, bottom perspective view of a portion of the printed circuit board of FIG. 4 that illustrates the arrangement of the conductors of the patch cord within the plug housing.
Figure 5D:
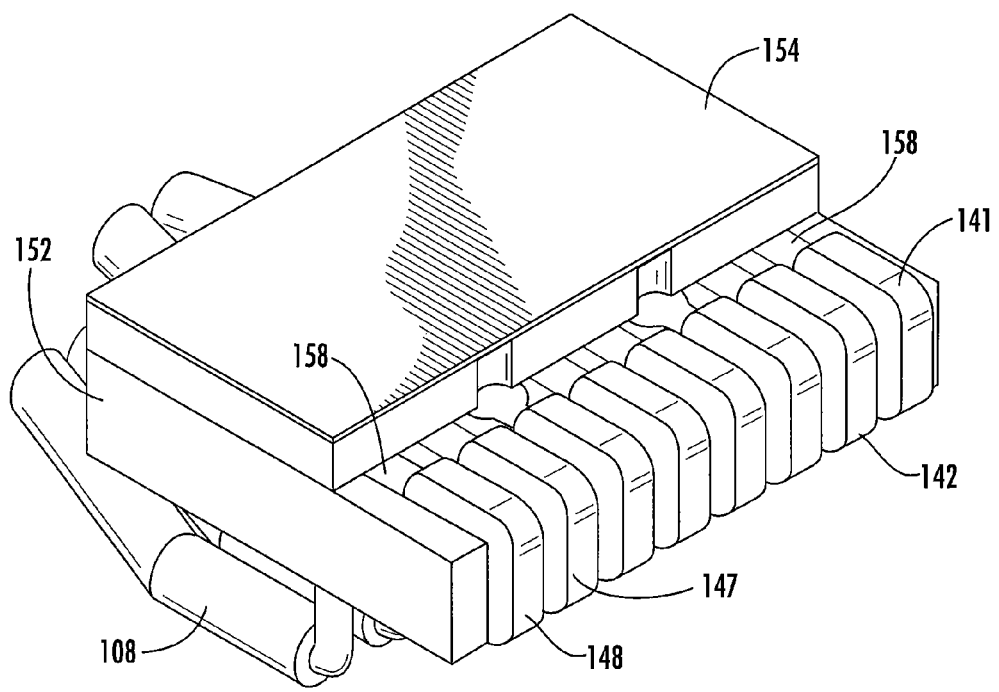
FIG. 5D is a front, top perspective view of a portion of the printed circuit board of FIG. 4.
Figure 17:
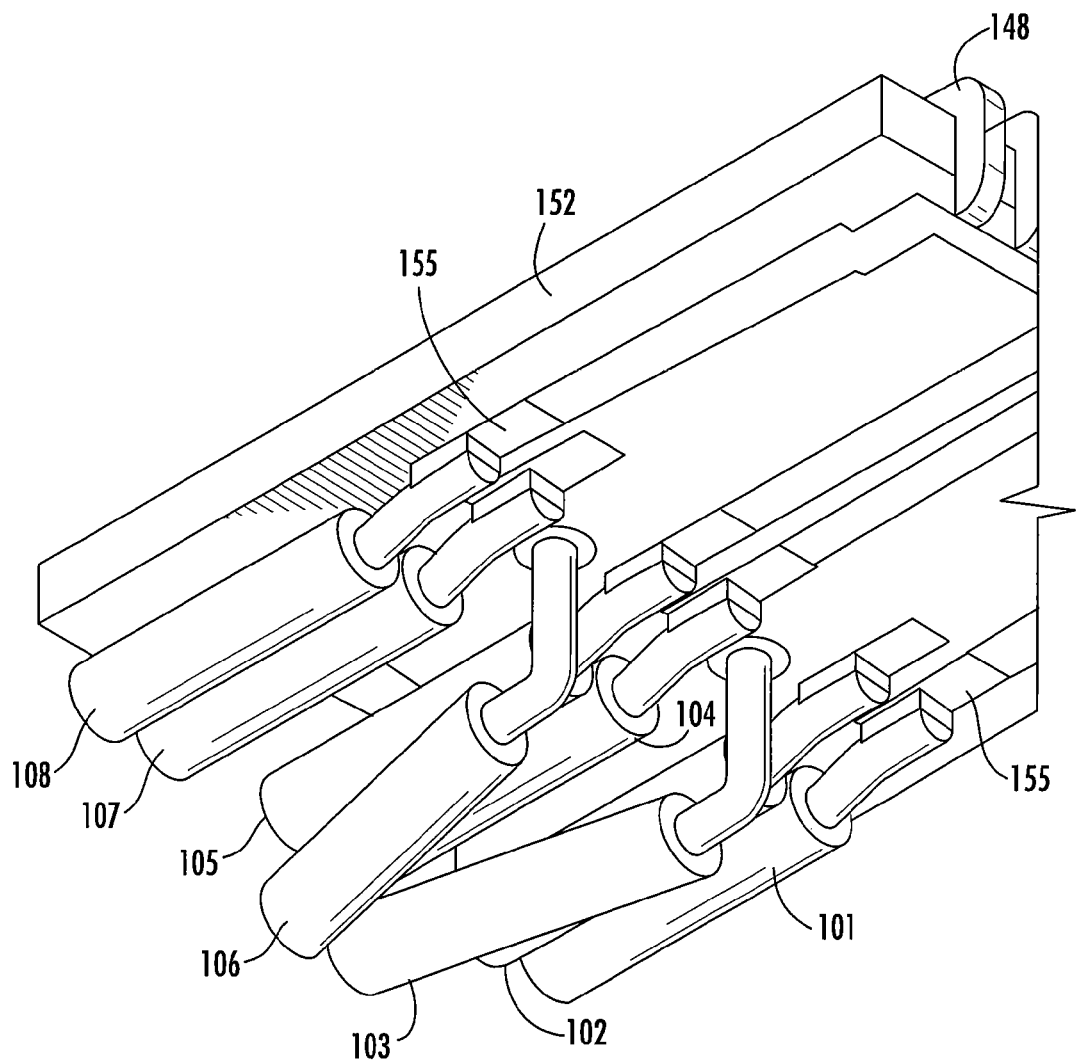
FIG. 17 is a bottom perspective view of a portion of a printed circuit board of a plug according to further embodiments of the present invention in which each conductor of a communication cable is terminated directly onto a respective one of a plurality of conductive pads that are provided on a bottom surface of the printed circuit board.

As shown best in FIGS. 5A and 5C, the first circuit board 152 includes eight metal-plated vias 156 on a bottom surface thereof. The insulation is removed from an end portion of each of the conductors 101-108 of the communications cable 109, and the metal (e.g., copper) core of each conductor 101-108 is inserted directly into a respective one of these metal-plated vias 156. In some embodiments, the conductors 101-108 may be soldered into place within their respective metal-plated vias 156. In other embodiments, each conductor 101-108 may include an eye-of-the needle termination or other appropriate termination that facilitates mounting the conductors 101-108 into their respective metal-plated vias 156. In still other embodiments, each of the metal-plated vias 156 may have a socket or other mechanism mounted therein that receives a respective one of the conductors 101-108. By terminating each of the conductors 101-108 directly into a metal-plated via 156 without the use of any insulation displacement contacts, insulation piercing contacts or other wire connection contacts, the size of the plug 116 may be reduced. Typically, the insulation is only removed from the portion of each conductor that is inserted in the printed circuit board 152, although more insulation is shown removed in the figures to clearly illustrate that it is the core of the conductors 101-108 that is inserted into the metal-plated vias 156. It will also be appreciated that other techniques may be used for terminating the conductors 101-108 into the printed circuit board 152. For example, in other embodiments, a plurality of insulation piercing contacts or insulation displacement contacts may be mounted on the printed circuit board 152 that are used to electrically connect each conductor 101-108 to a respective trace on the printed circuit board 152. As shown in FIG. 17, in still other embodiments each conductor 101-108 of communication cable 109 may be terminated directly onto a respective one of a plurality of conductive pads 155 that are provided on a surface of the printed circuit board 152. The conductors 101-108 may be mounted exclusively on the bottom surface of the printed circuit board structure 150, exclusively on the top surface of the printed circuit board structure 150, or on both the bottom and top surfaces of the printed circuit board structure 150.

As is best shown in FIG. 5B, the conductors 101-108 may be maintained in pairs within the plug 116. In particular, the first pair 111 of conductors 104, 105 is routed into the back of the plug housing 120 at a first distance below the bottom surface of the printed circuit board 152 and the third pair 113 of conductors 103, 106 is routed into the back of the plug housing 120 at a second distance below the bottom surface of the printed circuit board 152 that is less than the first distance such that the first pair 111 is positioned below the third pair 113. The second and fourth pairs 112, 114 of conductors 101, 102; 107, 108 are routed on opposite sides of the first and third pairs 111, 113 at a third distance below the bottom surface of the printed circuit board 152 that is between the first and second distances. In this manner, the four differential pairs 111-114 may be maintained in substantially the same position that they are maintained at within the cable 109, which may provide improved crosstalk performance as compared to conventional plug designs. While not shown in the figures, in some embodiments, each pair 111-114 may be maintained as a twisted pair all the way up to the point at which the conductors 101-108 are bent upwardly for insertion into the metal-plated vias 156 in the bottom surface of the first printed circuit board 152. This may also improve the electrical performance of the patch cord 100.

The plug blades 141-148 are configured to make mechanical and electrical contact with respective contacts, such as, for example, spring jackwire contacts, of a mating communications jack. In particular, as shown best in FIGS. 5A and 5C-5D, each of the eight plug blades 141-148 is mounted at the front portion of the first printed circuit board 152. The plug blades 141-148 may be substantially transversely aligned in side-by-side relationship. Each of the plug blades 141-148 includes a first section that extends forwardly along a top surface of the first printed circuit board 152, a transition section that curves through an angle of approximately ninety degrees and a second section that extends downwardly from the first section along the front edge of the first printed circuit board 152. The transition section may include a curved outer radius that complies with the specification set forth in, for example, IEC 60603-7-4 for industry standards compliant plug blades.

Each of the plug blades 141-148 may be fabricated separately from the printed circuit board 150. In the depicted embodiment, each of the plug blades 141-148 comprises an elongated metal strip having a length of approximately 140 mils, a width of approximately 20 mils and a height (i.e., a thickness) of approximately 20 mils. In another exemplary embodiment, each of the plug blades 141-148 comprises an elongated metal strip having a length of approximately 160 mils, a width of approximately 15 mils and a height of approximately 15 mils. In some embodiments, the height (i.e., the thickness) of the plug blades 141-148 may be as small as 2-3 mils. It will be appreciated that numerous other dimensions are acceptable. It will be appreciated, however, that both the length and the height of the plug blades may be varied substantially (the width of the plug blades is typically subject to less adjustment if the plug blade is to conform to the industry standards). In fact, in other embodiments, the height of the plug blades may be reduced considerably (e.g., to about 10 mils, or even to about 5 mils) to provide lower profile plug blades that couple less with adjacent plug blades.

The plug blades 141-148 may be mounted to the first printed circuit board 152 in a variety of different ways. As shown best in FIGS. 4, 5A and 5D, in the depicted embodiment, elongated contact pads 158 may be provided on the top surface of the first printed circuit board 152. Each of the contact pads 158 may be disposed directly under a respective one of the plug blades 141-148. The contact pads 158 may comprise, for example, copper pads or gold-plated copper pads that are formed as part of the first printed circuit board 152. Each of the plug blades 141-148 may be soldered to its respective contact pad 158 to mechanically and electrically connect each plug blade 141-148 to its respective contact pad 158. In some embodiments, each contact pad 158 may extend both on the top surface of the first printed circuit board 152 and downwardly along the front edge of the first printed circuit board 152 (i.e., under both the first and second sections of its respective plug blade 141-148) and the plug blade 141-148 may be soldered to the contact pad 158 both along the top surface and the front edge of the first printed circuit board 152 in order to ensure that the plug blade 141-148 is firmly bonded to its respective contact pad 158.

Figure 6A:
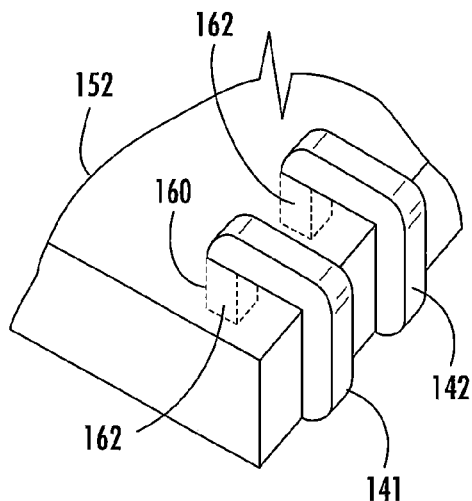
FIG. 6A is a front, top perspective view of a portion of a printed circuit board and plug blades that may be used in the plug of FIG. 4 according to further embodiments of the present invention.

While soldering the plug blades 141-148 to the contact pads 158 is one way of attaching the plug blades 141-148 to the printed circuit board 152, it will be appreciated that many other attachment mechanisms may be used. For example, as shown schematically in FIGS. 6A and 6C, in other embodiments, the plug blades 141-148 may be mounted to the first printed circuit board 152 by including a termination end on each plug blade 141-148 that is mounted in the first printed circuit board 152. For example, as shown in FIG. 6A, a plurality of rectangular (or other shaped) apertures 160 may be provided in a row along the top surface of the first printed circuit board 152 (only two apertures 160 and two plug blades 141, 142 are depicted in FIG. 6A), and each plug blade 141-148 may include a third section 162 that extends from the end of the first section at a ninety degree angle that is received within a respective one of these apertures 160. This third section 162 may or may not include a termination feature such as an eye-of-the-needle termination (not shown) that facilitates permanently mounting the first end of the plug blade 141-148 in its respective aperture 160. Alternatively or additionally, solder, conductive adhesives or other means of permanently mounting each plug blade 141-148 in its respective aperture 160 may be used.

Figure 6B:
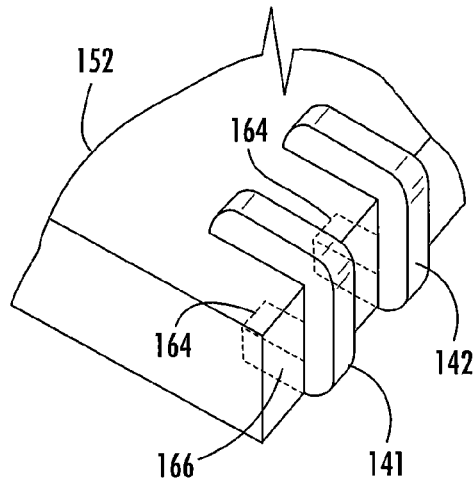
FIG. 6B is a front, top perspective view of a portion of a printed circuit board and plug blades that may be used in the plug of FIG. 4 according to additional embodiments of the present invention.

As shown in FIG. 6B, in other embodiments, a similar set of rectangular (or other shaped) apertures 164 could be provided in a row along the front edge of the first circuit board 152 (only two apertures 164 and two plug blades 141, 142 are depicted in FIG. 6B), and each plug blade 141-148 may include a fourth section 166 that extends from the end of the second section at a ninety degree angle so as to be received within a respective one of these apertures 164. Once again, this fourth section 164 may or may not include a termination feature such as an eye-of-the-needle termination (not shown) that facilitates permanently mounting the second end of the plug blade 141-148 in its respective aperture 164, and solder, adhesives or other means of permanently mounting each plug blade 141-148 in its respective aperture 164 may or may not be used.

Figure 6C:
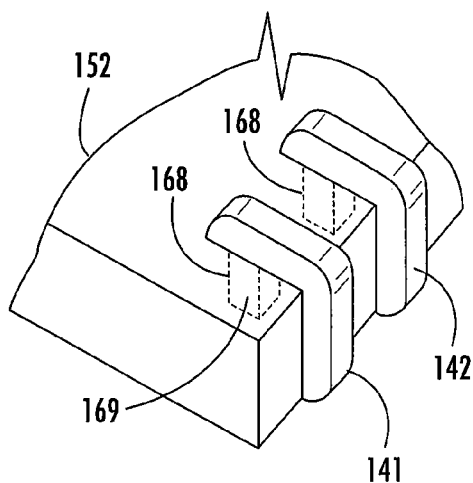
FIG. 6C is a front, top perspective view of a portion of a printed circuit board and plug blades that may be used in the plug of FIG. 4 according to still further embodiments of the present invention.

As shown in FIG. 6C, in still other embodiments, a set of rectangular (or other shaped) apertures 168 may be provided in a row along the front edge of the first circuit board 152 (only two apertures 168 and two plug blades 141, 142 are depicted in FIG. 6C), and each plug blade 141-148 may include a fifth section 169 that extends at a ninety degree angle from a middle portion of the plug blade 141-148. The fifth section 169 of each plug blade may be received in a respective aperture 168 in the top surface of the first printed circuit board 152 (or, alternatively, along the front edge of the first printed circuit board if the fifth section 169 extends from the second section of the plug blade). It will likewise be appreciated that some of the plug blades 141-148 may be mounted to the first printed circuit board 152 using one of the above-described techniques, while other of the plug blades 141-148 may be mounted to the first printed circuit board 152 using another of the above described techniques. By way of example, plug blades 141, 143, 145 and 147 may each include a third section 162 and be mounted in the manner illustrated in FIG. 6A, while plug blades 142, 144, 146 and 148 may each include a fourth section 166 and be mounted in the manner illustrated in FIG. 6B. It will also be appreciated that a wide variety of other techniques may be used to mount the plug blades 141-148 to the first printed circuit board 152.

Turning again to FIG. 5A, it can be seen that a plurality of conductive paths 170 are provided in the first and second printed circuit boards 152, 154. Each of these conductive paths 170 electrically connects one of the metal-plated vias 156 to a respective one of the contact pads 158 so as to provide an electrical path between each of the conductors 101-108 that are terminated in the metal-plated vias 156 and a respective one of the plug blades 141-148. Each conductive path 170 may comprise, for example, one or more conductive traces that are provided on one or more layers of the printed circuit board 152 and/or the printed circuit board 154. When a conductive path 170 includes conductive traces that are on multiple layers of one of the printed circuit boards 152, 154 or which extends between the two printed circuit boards 152, 154, metal-plated or metal-filled through holes (or other layer-transferring structures known to those skilled in this art) may be provided that provide an electrical connection between the conductive traces on different layers of the printed circuit boards 152, 154.

As discussed above, the plug blades 141-148 may be implemented using components that are fabricated separately from the printed circuit board 150 (as opposed to conductive structures that are part of the printed circuit board 150). These separately fabricated plug blades 141-148 are permanently mounted onto the printed circuit board 150. Using separately fabricated plug blades 141-148 may allow the plug blades 141-148 to be thicker structures that may be more robust and more easily withstand wear during use. However, the plug blades 141-148 are designed to have a low profile in order to reduce the cross-sectional area of each plug blade that faces an adjacent plug blade, thereby decreasing the amount of both the capacitive and inductive coupling between adjacent plug blades. As will be discussed in more detail herein, this may facilitate providing plugs that have enhanced electrical performance.

In order to ensure that plugs and jacks that are manufactured by different vendors will work well with each other, certain industry standards such as, for example, TIA-568-C.2-2009 require that each plug exhibit pair-to-pair NEXT and FEXT levels that are within specified ranges at certain frequencies. The use of low profile plug blades may reduce coupling between adjacent plug blades such that insufficient amounts of NEXT and/or FEXT may be generated between the pairs 111-114 in the plug such that the plug does not comply with these industry standards. If this occurs, capacitors and/or other coupling elements may be implemented, for example, within the printed circuit boards 152 and/or 154 in order to generate sufficient amounts of offending crosstalk such that the plug complies with the industry standards. These capacitors and/or other coupling elements are not shown in FIGS. 4-6 in order to simplify the drawings.

In some embodiments, capacitors and/or other coupling elements that are used to generate the additional offending crosstalk may be attached to non-signal current carrying portions of the plug blades 141-148. As described in detail in co-pending U.S. patent application Ser. No. 12/795,843 filed Jun. 8, 2010 and entitled COMMUNICATIONS PLUGS HAVING CAPACITORS THAT INJECT OFFENDING CROSSTALK AFTER A PLUG-JACK MATING POINT AND RELATED CONNECTORS AND METHODS, by injecting offending crosstalk at a non-signal current carrying portions of the plug blade it may be possible to align in time the points at which much of the offending crosstalk (in the plug) and the compensating crosstalk (in a mating jack) occur, which can significantly enhance the degree of crosstalk compensation. The entire content of U.S. patent application Ser. No. 12/795,843 is incorporated herein by reference as if set forth in its entirety, and it will be understood that the techniques for generating additional offending crosstalk that are taught in this application may be applied in the communications plugs according to embodiments of the present invention.

Figure 7:
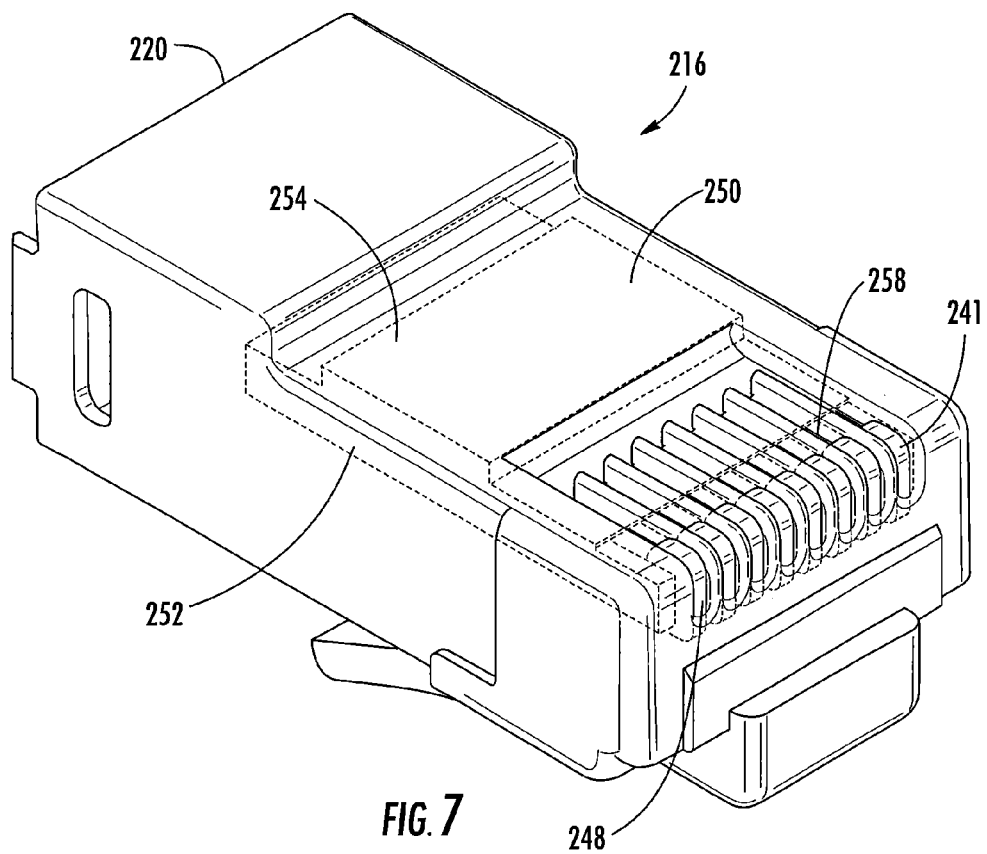
FIG. 7 is a front perspective view of the plug housing and printed circuit board of a communications plug according to further embodiments of the present invention.
Figure 8:
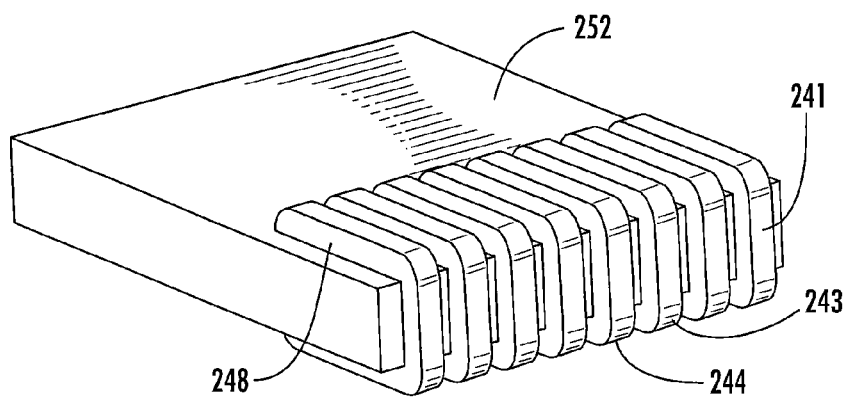
FIG. 8 is a perspective view of the printed circuit board and the plug blades of the plug of FIG. 7.
Figure 9:
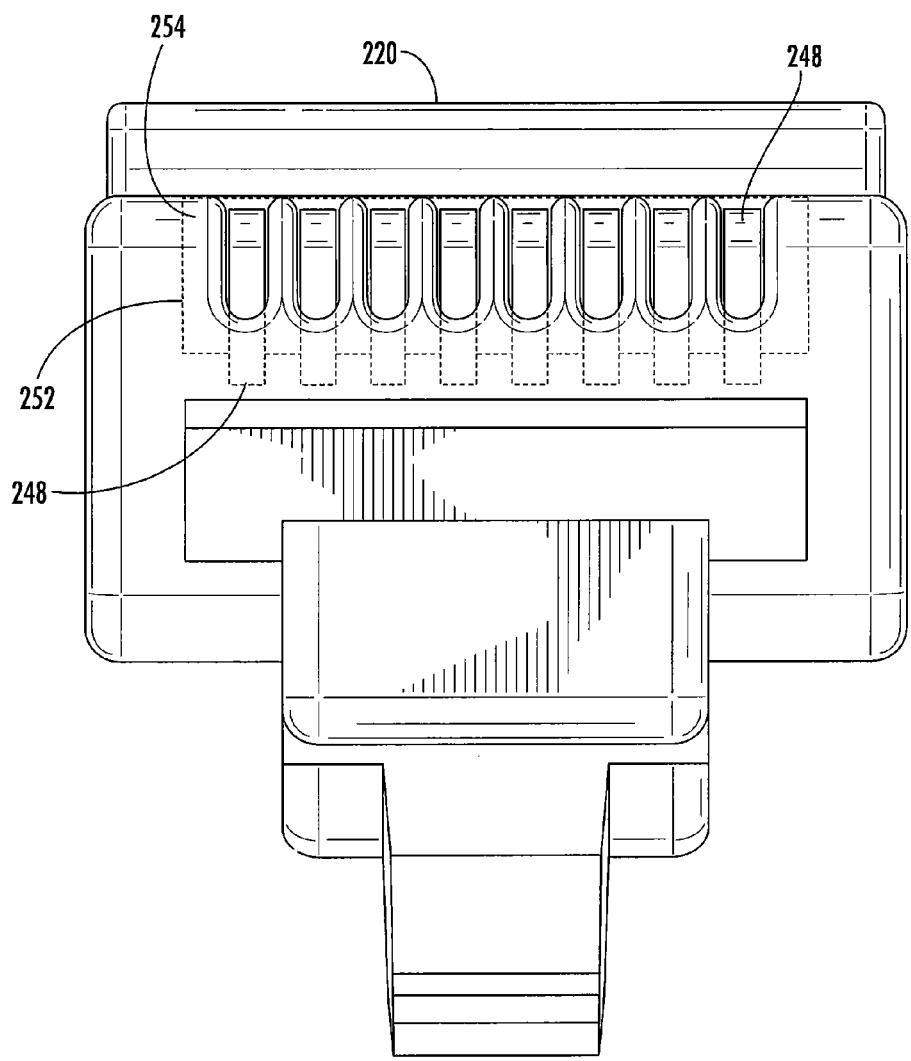
FIG. 9 is a front view of the plug housing and printed circuit board of FIG. 7.

FIGS. 7-9 illustrate a communications plug 216 according to further embodiments of the present invention. In particular, FIG. 7 is a front perspective view of the plug 216, FIG. 8 is a perspective view of a portion of the printed circuit board and the plug blades of the plug 216, and FIG. 9 is a front view of the plug 216. The communications plug 216 may be used, for example, to replace the plugs 116 and 118 in the patch cord 100 of FIG. 3.

As shown in FIG. 7, the plug 216 includes a housing 220 that may be identical to the housing 120 of the plug 116 of FIGS. 4-5. As with the plug 116, the plug 216 may include a rear cap, wire retention and grooming mechanisms and a strain relief boot that are not depicted in FIG. 7 in order to simplify the drawing.

The communications plug 216 further includes a printed circuit board structure 250 that includes a first printed circuit board 252 and a second printed circuit board 254. The printed circuit board structure 250 may be essentially identical to the printed circuit board structure 150 of the plug 116 that is described above with reference to FIGS. 4-5. A plurality of plug blades 241-248 are mounted on the first printed circuit board 252. The printed circuit board 252 includes a plurality of contact pads 258 that may be identical to the contact pads 158 described above with respect to the plug 116. As shown best in FIG. 8, the plug blades 241-248 differ from the plug blades 141-148 of the plug 116 in that the plug blades 241-248 each include a third section that extends along the bottom surface of the first printed circuit board 252.

It will also be appreciated that while printed circuit board structures that include two separate printed circuit boards are illustrated in the exemplary embodiments provided above, in other embodiments the printed circuit board structure may comprise a single printed circuit board.

FIG. 8 illustrates the design of the plug blades 241-248 in greater detail. As shown in FIG. 8, the first section of each plug blade 241-248 that extend along the top surface of the first printed circuit board 252 is somewhat longer than the first section of each plug blade 141-148 of the plug 116. The second section of each plug blade 241-248 that extends down the front edge of the first printed circuit board 252 is similar to the second section of each plug blade 141-148 of the plug 116, but is slightly longer so as to connect with a third section of the plug blade that extends along the bottom surface of the first printed circuit board 252. The third section of each plug blade 241-248 that extends along the bottom surface of the first printed circuit board 252 may be approximately the same length as the first section of each plug blade 241-248 so that each plug blade 241-248 generally has a "U" shape (as compared to the generally "L" shaped plug blades 141-148 of the plug 116). In some embodiments, each plug blade 241-248 may be formed of a resilient metal such as, for example, spring-tempered phosphor bronze, beryllium copper, or the like. The interior width of the "U" shaped interior of each plug blade 241-248 may be slightly less than the thickness (height) of the first printed circuit board 252. The plug blades 241-248 may be "resiliently" mounted on the printed circuit board 252 by spreading the legs of each plug blade (i.e., the first and third sections) apart and then mounting the plug blade on the first printed circuit board 252 in the positions shown in FIG. 8. The resilient nature of the plug blade then serves to hold the plug blade in place. Additionally, retention features may also be provided on interior surfaces of the plug housing 220 that firmly trap each plug blade 241-248 in its proper position once the first printed circuit board 252 (with the plug blades 241-248 thereon) is inserted into the housing 220. In some embodiments, channels may be formed for each plug blade 241-248 in the top surface, the bottom surface and/or the front edge of the first printed circuit board 252 that work with the resiliency of the plug blades 241-248 to hold each plug blade in its proper position on the printed circuit board 252.

While the embodiment depicted in FIGS. 7-9 terminates the plug blades 241-248 onto the printed circuit board using the resiliency of the plug blades 241-248, it will be appreciated that any of the techniques discussed above with respect to FIGS. 4-6 may be used to terminate the plug blades 241-248 into the printed circuit board 252. Otherwise, the plug 216 may be identical to the plug 116 discussed above and may use, for example, the same techniques for terminating each of the conductors 101-108 of a communications cable 109 into the printed circuit board 252 that are discussed above with respect to FIGS. 5A-5D and 17 that are used to terminate the conductors 101-108 into the printed circuit board 152 of plug 116.

Figure 10:
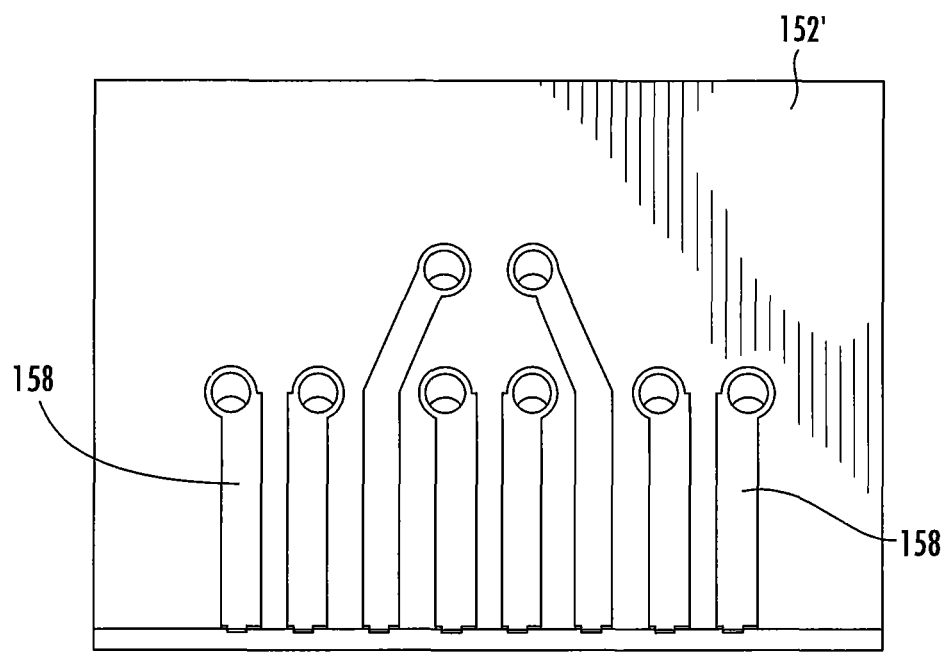
FIG. 10 is a schematic diagram illustrating a communications plug printed circuit board according to embodiments of the present invention that has eight metal-plated apertures that receive the conductors of a communications cable.
Figure 11:
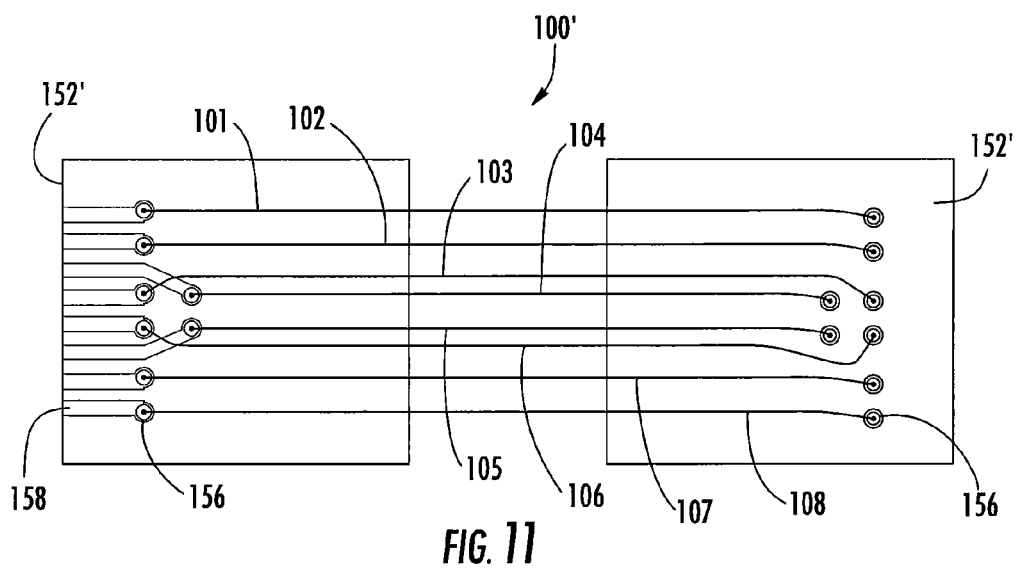
FIG. 11 is a schematic diagram illustrating how two plugs that have the printed circuit board of FIG. 10 may be used to implement the patch cord of FIG. 3.
Figure 12:
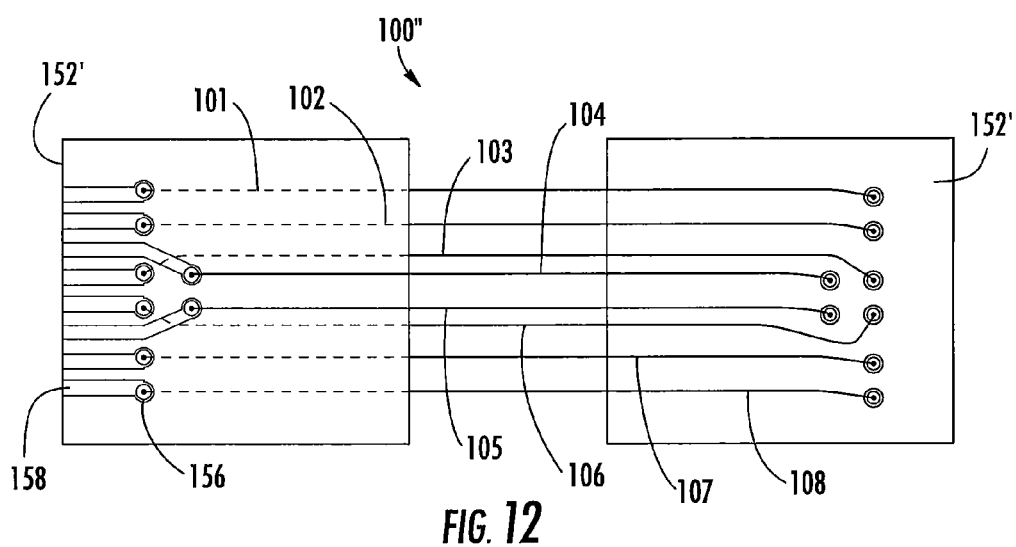
FIG. 12 is a schematic diagram illustrating another way in which two plugs that have the printed circuit board of FIG. 10 may be used to implement the patch cord of FIG. 3.
Figure 13:
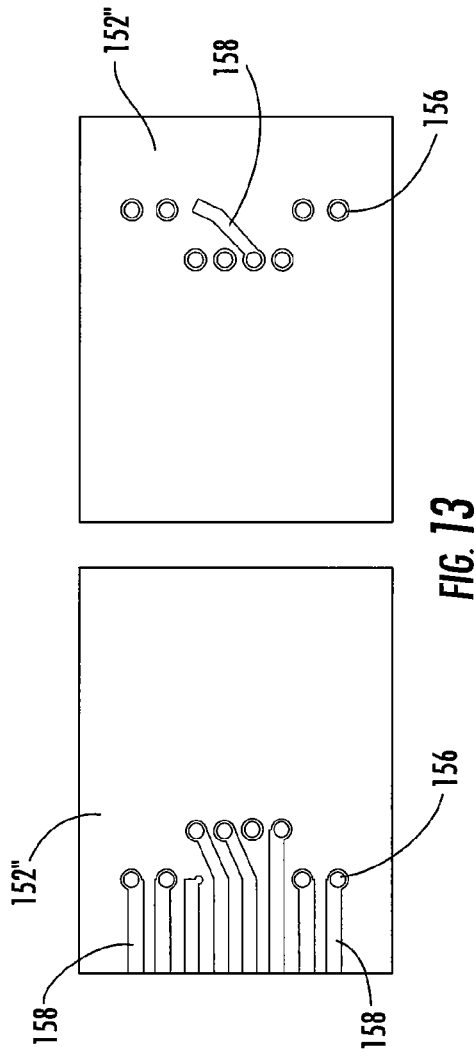
FIG. 13 is a schematic diagram illustrating a communications plug printed circuit board according to further embodiments of the present invention that has eight metal-plated apertures that receive the conductors of a communications cable.
Figure 14:
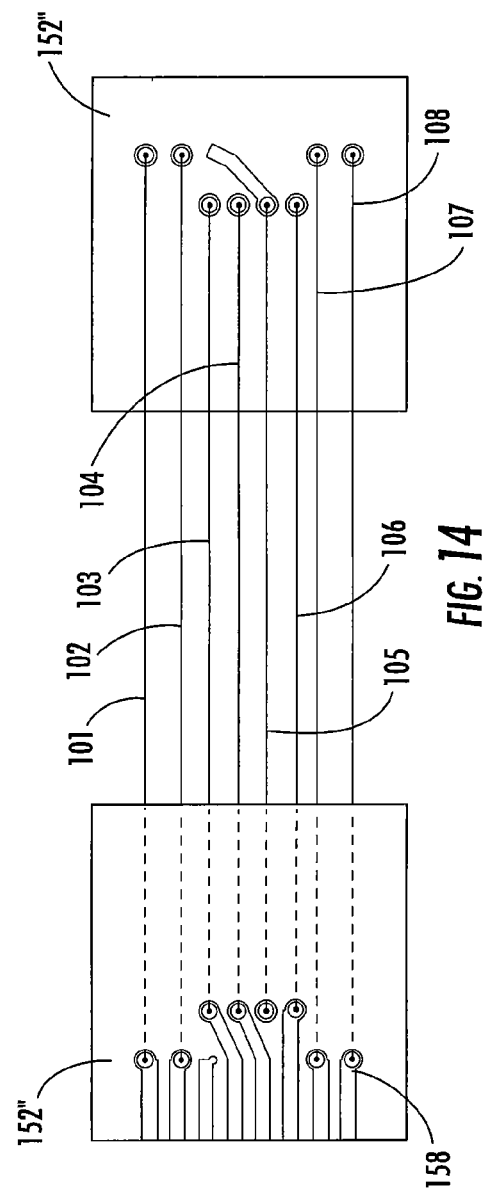
FIG. 14 is a schematic diagram illustrating how two plugs that have the printed circuit board of FIG. 13 may be used to implement the patch cord of FIG. 3.

FIGS. 10 and 13 illustrate two different plug printed circuit boards according to further embodiments of the present invention that use alternative patterns for the metal-plated vias 156 that receive the conductors 101-108 of the communications cable 109. FIGS. 11-12 and 14 illustrate several different ways that two plugs that have the printed circuit boards of either FIG. 10 or FIG. 13 may be wired to implement a patch cord.

In particular, FIG. 10 is a schematic view of a portion of the top surface of a modified version of the first printed circuit board 152 of plug 116 which has been designated 152'. As shown in FIG. 10, eight contact pads 158 are disposed on the top surface of the printed circuit board 152'. A respective one of the plug blades 141-148 (not shown in FIG. 10) is mounted on top of the forward portion of each of these contact pads 158. A metal-plated via 156 is provided at the end of each of the contact pads 158. The eight conductors 101-108 of the cable 109 (not shown in FIG. 10) may be terminated into respective ones of the eight metal-plated via 156. As shown in FIG. 10, the metal-plated vias 156 are arranged in two rows, with the vias 156 for pairs 111, 112 and 114 arranged in a first row, and with the vias 156 for pair 113 arranged in a second row that is offset from the first row. Each of the metal-plated vias 156 is physically and electrically connected to a respective one of the elongated contact pads 158. The contact pad 158 that connects to the metal-plated via 156 that receives conductor 103 runs between the metal plated vias 156 that receive conductors 102 and 104, and the contact pad 158 that connects to the metal-plated via 156 that receives conductor 106 runs between the metal plated vias 156 that receive conductors 105 and 107. This arrangement of the metal-plated vias 156 allows all four of the conductor pairs 111-114 to remain twisted right up to the point at which the conductors of the pairs are terminated into the printed circuit board 152, which may improve the electrical performance characteristics (e.g., crosstalk, return loss, etc.) of the plug 116. In other embodiments, the twisted conductor pairs 111-114 may transition to non-twisted parallel pairs of specified geometries at specified distances from the point of termination, to facilitate assembly while preserving control of crosstalk and impedances, as is shown in FIGS. 5A-D.

FIGS. 11 and 12 illustrate two exemplary ways in which plugs that are implemented using the printed circuit board 152' of FIG. 10 may be connected to the conductors 101-108 of a communications cable 109 in order to implement patch cords 100' and 100", respectively. In particular, as shown in FIG. 11, the conductors 101-108 of the cable 109 are all terminated into the top side of the printed circuit board 152' that is included in the plug that is mounted on the left side of the patch cord 100'. In contrast, the conductors 101-108 of the cable 109 are all terminated into the bottom side of the printed circuit board 152' that is included in the plug that is mounted on the right side of the patch cord 100' (i.e., the printed circuit board 152' on the right side of the patch cord is flipped over). As a result, each end of each of the conductors 101-108 may be connected to the same metal-plated via 156 in each of the two printed circuit boards 152' even though the two printed circuit boards 152' face in opposite directions. The plug blades 241-248 that are included in the plug 216 of FIGS. 7-9 may be particularly appropriate for use in the patch cord 100' of FIG. 11.

As shown in FIG. 12, in another embodiment, conductors 101-103 and 106-108 may terminate onto a top side of the printed circuit board 152' that is included in the plug that is mounted on the left side of the patch cord 100", while conductors 104 and 105 are terminated into the bottom side of this printed circuit board (the dashed lines in FIG. 12 indicate that the conductor is travelling on the other side of the printed circuit board 152'). All eight of the conductors 101-108 are terminated into the bottom side of the printed circuit board 152' that is included in the plug that is mounted on the right side of the patch cord 100". Once again, this arrangement allows each end of each of the conductors 101-108 to be connected to the same metal-plated via 156 in each of the two printed circuit boards 152' even though the two printed circuit board 152' face in opposite directions. The plug blades 241-248 that are included in the plug 216 of FIGS. 7-9 may also be particularly appropriate for use in the patch cord 100" of FIG. 12.

FIG. 13 is a schematic view of a portion of both the top surface (left hand side drawing) and the bottom surface (right hand side drawing) of another modified version of the first printed circuit board 152 of plug 116 which has been designated 152". As shown in FIG. 13, eight contact pads 158 are disposed on the top surface of the printed circuit board 152". Seven of these contact pads 158 connect directly to a respective metal-plated via 156. The eighth contact pad 158 is electrically connected to its respective metal-plated via 156 through a conductive trace segment 158 that is provided on the bottom of printed circuit board 152" and through a metal-filled aperture (not visible in FIG. 13) that electrically connects the contact pad 158 at issue to the conductive trace segment 158 that is provided on the bottom of printed circuit board 152". A respective one of the plug blades 141-148 (not shown in FIG. 13) is mounted on top of the forward portion of each of the contact pads 158. The eight conductors 101-108 of the cable 109 (not shown in FIG. 13) may be terminated into respective ones of the eight metal-plated vias 156. As shown in FIG. 13, the metal-plated vias 156 are arranged in two rows, with the vias 156 for pairs 112 and 114 arranged in a first row, and with the vias 156 for pairs 111 and 113 arranged in a second row that is offset from the first row. Each of the metal-plated vias 156 is physically and electrically connected to a respective one of the elongated contact pads 158.

FIG. 14 illustrates how two plugs that are implemented using the printed circuit board 152" of FIG. 13 may be connected to the conductors 101-108 of a communications cable 109 in order to implement a patch cord. As shown in FIG. 14, the conductors 101-108 of the cable 109 are all terminated into the bottom side of the printed circuit board 152" that is included in the plug that is mounted on the left side of the patch cord. In contrast, the conductors 101-108 of the cable 109 are all terminated into the top side of the printed circuit board 152" that is included in the plug that is mounted on the right side of the patch cord. As a result, each end of each of the conductors 101-108 may be connected to the same metal-plated via 156 in each of the two printed circuit boards 152" even though the two printed circuit board 152" face in opposite directions. The plug blades 241-248 that are included in the plug 216 of FIGS. 7-9 may be particularly appropriate for use in the patch cord of FIG. 14.

The low-profile plug blades that are included in communications plugs according to certain embodiments of the present invention allow the plug housing to be smaller than the housing specified in the industry standards for standards-compliant RJ-45 plug. Accordingly, smaller RJ-45 jacks could be designed that would allow an increased density of jacks to be included on patch panels, network switches and the like. "Density" refers to the number of jacks, per unit volume or unit area for providing connections within an equipment rack; thus, increased density can provide more connection/patching sites per rack. Many equipment racks are configured to mount patch panels and equipment (e.g., network switches) that are multiples of a standard height of 1.75 inches, which height is known in the industry as a "U"). Currently, patch panels and network switches generally provide two rows of 24 jacks for each U of rack space. With plugs according to embodiments of the present invention, patch panels and/or network switches may be provided that include three rows of 24 jacks within a single U of space.

Figure 15A:
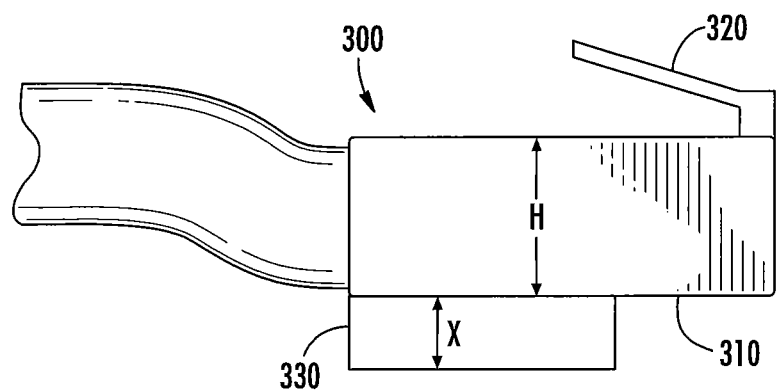
FIGS. 15A and 15B are schematic block diagrams illustrating a communications plug that includes a slidably mounted adapter that allows the plug to fit within both standard RJ-45 jacks and within low profile RJ-45 jacks.
Figure 15B:
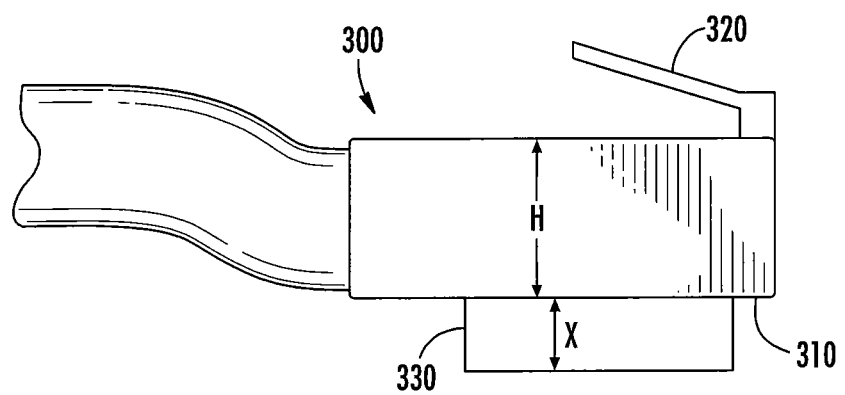

Unfortunately, one drawback of plugs that have such smaller housings is that they would not be industry-standards compliant, and hence they would not work with industry-standards compliant jacks. In order to overcome this shortcoming, pursuant to further embodiments of the present invention, plug adapters are provided that may be used to convert a smaller RJ-45 plug into an industry standards compliant RJ-45 plug. In some embodiments, the adapter may be slidably mounted on the plug housing, as is schematically illustrated in FIGS. 15A-B. In particular, as shown in FIG. 15A, a plug 300 may be provided that includes a housing 310, a latch 320 and an adapter 330. The housing 310 may have a height "H" that is shorter than the height of an industry standards compliant RJ-45 plug. The adapter 330 may be slidably mounted on the housing 310, and may extend a distance "X" below housing 310 such that H+X is equal to the height of the housing of an industry standards-compliant RJ-45 plug.

As shown in FIGS. 15A-B, when the plug 300 is to be used in a low profile jack, the adapter 330 may be slid rearwardly (e.g., 250 mils) out of the way so that the plug 300 will fit into the smaller plug aperture on the low profile jack. In contrast, when the plug 300 is to be used in a standard RJ-45 jack, the adapter 330 may be slid forwardly so that the plug housing 310 will have a height at the front part of the plug 300 that meets the industry standards.

Figure 16:
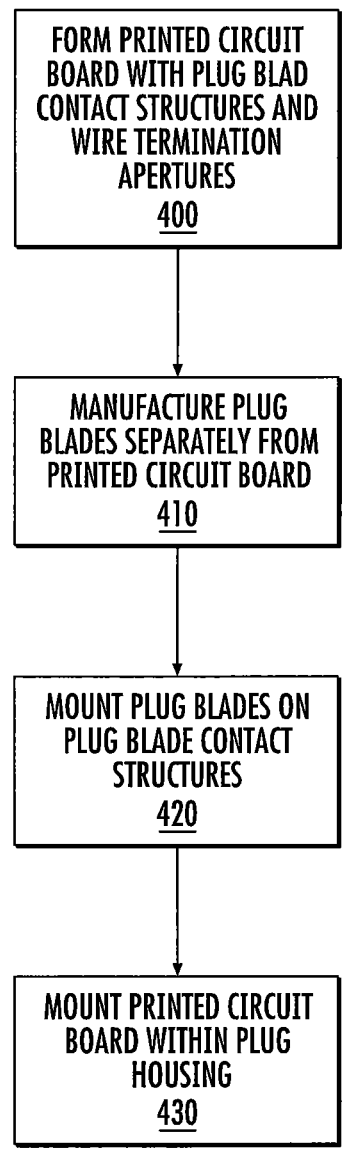
FIG. 16 is a flow chart of a method of manufacturing a communications plug according to certain embodiments of the present invention.

Pursuant to further embodiments of the present invention, methods of manufacturing an RJ-45 communications plug are provided. As shown in the flow chart of FIG. 16, pursuant to these methods, a printed circuit board is formed that includes a plurality of wire termination apertures, a plurality of plug blade contact structures and a plurality of conductive paths that connect each respective wire termination aperture to a corresponding plug blade contact structure (block 400). A plurality of plug blades are manufactured separately from the printed circuit board (block 410). Each of the separately manufactured plug blades is mounted onto the printed circuit board so that each plug blade is in electrical contact with a respective one of the plug blade contact structures (block 420). Finally, the printed circuit board with the plug blades thereon is mounted at least partially within a plug housing (block 430).

The plug blade contact structures may be, for example, a plurality of contact pads on the printed circuit board. Alternatively, the plug blade contact structures may be a plurality of metal-plated vias in the printed circuit board which each receive a termination end of a respective one of the plug blades. Other plug contact structures may also be used. Moreover, the method may further include directly terminating the conductors of a communications cable into the respective wire termination apertures in the printed circuit board in order to form a communications patch cord. Any of the plug blades described above may be used in the above described method of FIG. 16.

According to still further embodiments of the present invention, the low profile plug blades that are discussed above could be plated directly onto the printed circuit board instead of being mounted as a separate piece. In such embodiments, the printed circuit board may be manufactured to have a radius on a leading edge thereof that complies with the industry standardized requirements for the radius on RJ-45 plug blades. A conductive metal such as copper or gold plated copper would then be plated onto the top surface and the front surface of the printed circuit board to form each low profile plug blade. The low profile plug blades manufactured in this manner could have the shape of, for example, any of the low plug blades that are disclosed herein. Typically, when this approach is used the low profile plug blades would be substantially thinner than is shown in the figures, with a thickness of less than 10 mils and, in some cases, a thickness of less than 5 mils.

The present invention is not limited to the illustrated embodiments discussed above; rather, these embodiments are intended to fully and completely disclose the invention to those skilled in this art. In the drawings, like numbers refer to like elements throughout. Thicknesses and dimensions of some components may be exaggerated for clarity.

Spatially relative terms, such as "top," "bottom," "side," "upper," "lower" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "under" or "beneath" other elements or features would then be oriented "over" the other elements or features. Thus, the exemplary term "under" can encompass both an orientation of over and under. The device may be otherwise oriented (rotated 90 degrees or at other orientations) and the spatially relative descriptors used herein interpreted accordingly.

The present invention is directed to modular communications plugs such as RJ-45 plugs. As used herein, the terms "forward" and "front" and derivatives thereof refer to the direction defined by a vector extending from the center of the plug toward the portion of the plug that is first received within a plug aperture of a jack when the plug is mated with a jack. Conversely, the term "rearward" and derivatives thereof refer to the direction directly opposite the forward direction.

Well-known functions or constructions may not be described in detail for brevity and/or clarity. As used herein the expression "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises", "comprising", "includes" and/or "including" when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The foregoing is illustrative of the present invention and is not to be construed as limiting thereof. Although exemplary embodiments of this invention have been described, those skilled in the art will readily appreciate that many modifications are possible in the exemplary embodiments without materially departing from the novel teachings and advantages of this invention. Accordingly, all such modifications are intended to be included within the scope of this invention as defined in the claims. The invention is defined by the following claims, with equivalents of the claims to be included therein.

That which is claimed is:

1. An RJ-45 communications plug comprising:
   a housing having a plurality of slots;
   a printed circuit board having a top surface, a bottom surface and a front edge, the printed circuit board at least partly received within the housing; and
   a plurality of plug blades, wherein a first of the plug blades is received within a first aperture in the front edge of the printed circuit board.

2. The RJ-45 communications plug of claim 1, wherein the first aperture is a first of a plurality of apertures in the front edge of the printed circuit board, and wherein each of the plug blades is mounted in a respective one of the apertures.

3. The RJ-45 communications plug of claim 1, wherein the first of the plug blades includes a first section that extends along the top surface of the printed circuit board, a second section that extends along the front edge of the printed circuit board and a termination post section that extends into the aperture.

4. The RJ-45 communications plug of claim 3, wherein at least a portion of the first section of the first of the plug blades is exposed by a first of the plurality of slots.

5. The RJ-45 communications plug of claim 3, wherein the first of the plug blades includes a transition section having a curved outer radius, the transition section connecting the first section to the second section.

6. The RJ-45 communications plug of claim 3, wherein the first section of the first of the plug blades directly contacts the top surface of the printed circuit board along its length.

7. The RJ-45 communications plug of claim 1, further comprising a plurality of wire connection terminals, wherein each plug blade is electrically connected to a respective one of the wire connection terminals by a respective conductive path through the printed circuit board.

8. The RJ-45 communications plug of claim 1 mounted on a first end of a communications cable with a second RJ-45 communications plug according to claim 1 mounted on a second end of the communications cable to provide a patch cord.

* * * * *